United States Patent
Liu et al.

(10) Patent No.: US 8,223,286 B2
(45) Date of Patent: Jul. 17, 2012

(54) DISPLAY PANEL

(75) Inventors: Chih-Chung Liu, Guangdong (CN); Cheng-Hsin Chen, Guangdong (CN)

(73) Assignee: Century Display(ShenZhen)Co., Ltd., Century Science Park, Mingqing Rd. Longhua, Baoan, Shen-zhen, Guangdong (CN)

( * ) Notice: Subject to any disclaimer, the term of this patent is extended or adjusted under 35 U.S.C. 154(b) by 190 days.

(21) Appl. No.: 12/869,723

(22) Filed: Aug. 26, 2010

(65) Prior Publication Data
US 2010/0321602 A1 Dec. 23, 2010

Related U.S. Application Data

(63) Continuation of application No. PCT/CN2009/072487, filed on Jun. 26, 2009.

(30) Foreign Application Priority Data

May 6, 2009 (CN) .......................... 2009 1 0039268

(51) Int. Cl.
*G02F 1/136* (2006.01)

(52) U.S. Cl. ....................................................... 349/42
(58) Field of Classification Search .................. None
See application file for complete search history.

(56) References Cited

U.S. PATENT DOCUMENTS

2002/0154253 A1* 10/2002 Cairns et al. ..................... 349/43
2007/0165171 A1* 7/2007 Lee ................................ 349/139

* cited by examiner

*Primary Examiner* — Tina Wong
(74) *Attorney, Agent, or Firm* — Winston Hsu; Scott Margo

(57) ABSTRACT

The present invention provides a display panel including a plurality of dual-gate pixel units connected to each other through data lines, gate lines and common lines. Each dual-gate pixel unit includes a first pixel and a second pixel respectively connected to a first gate line and a second gate line, and shares a common line and a data line. The first pixel and the second pixel are respectively disposed at two opposite sides of the common line, and they are also respectively disposed at two opposite sides of the first data line and the second gate line. The data lines transfer data signals into pixels, and the gate lines control the pixels to receive the data signals. The present invention raises an aperture ratio of each pixel of the display panel, and reduces the probability of the gate line and the common line being short-circuited.

27 Claims, 10 Drawing Sheets

US 8,223,286 B2

DISPLAY PANEL

CROSS REFERENCE TO RELATED APPLICATIONS

This application is a continuation of International Application No. PCT/CN2009/072487 filed on Jun. 26, 2009.

BACKGROUND OF THE INVENTION

1. Field of the Invention

The present invention relates to a display panel, and more particularly, to a display panel with high quality display.

2. Description of the Prior Art

Please refer to FIG. 1. In the conventional active matrix type liquid crystal display (LCD), each pixel of a single-gate circuit structure includes a thin-film transistor (TFT) 10. A gate electrode of the TFT 10 is connected to a horizontal gate line 12, and a source electrode of the TFT 10 is connected to a vertical data line 14. A drain electrode of the TFT 10 is connected to a pixel electrode, and the TFTs 10 in two adjacent columns are respectively connected to corresponding data lines 14.

The following description introduces a basic operating method of the conventional circuit structure. In a same horizontal gate line 12, the gate electrodes of the TFTs 10 are electrically connected to each other, so that voltages respectively applied to the TFTs are related to each other. If a large enough positive voltage is applied to a gate line 12, all TFTs 10 connected to this gate line 12 will be turned on. The pixel electrodes disposed along this gate line 12 are respectively electrically connected to the vertical data lines 14, and corresponding data signals are transferred into the vertical data lines 14 so as to charge the pixel electrodes to appropriate voltages. Next, a large enough negative voltage is applied to turn off the TFTs 10 until the next data signals are written into the TFTs 10 again. During the intervening time between transferring the data signals and transferring the next data signals, the electric charges are stored on the liquid crystal capacitor. The next horizontal gate line 12 is then started, and the corresponding data signals are transferred into the data lines 14. The data signals of a whole frame can be written into the TFTs 10 in sequence according to the above-mentioned method. After that the process of transferring the data signals can be performed again from the first gate line.

Because the plurality of data lines match source chips in the above-mentioned single gate circuit structure, more source chips should be used, and the cost of the display panel is rather high. In order to reduce the cost, a dual-gate circuit structure is provided, as shown in FIG. 2. TFTs 16 in two adjacent columns share the same data line 18. The number of the data lines 18 can be reduced, and the number of the source chips is also reduced. Accordingly, the manufacturing cost of the display panel is reduced.

However, as shown in FIG. 3, in the circuit layout of the above-mentioned prior art, the gate line 20 and the common line 22 are formed by the same metal layer and they are substantially close to each other. In the manufacturing process, if particles are dropped onto the substrate inadvertently, the gate lines 20 and the common lines 22 easily can be short-circuited after the manufacturing process, causing dark stripes or bright stripes on the display panel. In addition, the aperture ratio of the whole display panel is reduced. Two electrodes 24 disposed between adjacent gate lines and between adjacent data lines 18 are respectively display regions of two pixels, and the common line 22 overlaps a transmissive region of the electrode layer 24. Therefore, an area of the transmissive region of the electrode layer 24 deducting the metal layer of the common line 22 is reduced and the aperture ratio of the whole display panel is decreased.

According to the above-mentioned problems, the present invention provides a display panel with a high quality display to solve the problems generated in the prior art.

SUMMARY OF THE INVENTION

It is therefore an objective of the present invention to provide a display panel in which common lines are respectively disposed between the adjacent gate lines to reduce the number of the common lines, so that the aperture ratio of each pixel in the display panel can be raised, and the probability of the gate lines and the common lines short-circuiting can be reduced.

In order to achieve above mentioned objectives, the present invention provides a high quality display panel. The display panel includes a plurality of gate lines, a plurality of data lines perpendicular to the gate lines, a plurality of common lines parallel to the gate lines and a plurality of dual-gate pixel units. The gate lines include a first gate line and a second gate line, and the first gate line and the second gate line are parallel to each other. The data lines include a first data line. The common lines include a first common line, and the first gate line and the second gate line being respectively disposed at two opposite sides of the first common line. Each dual-gate pixel unit is connected to one of the data lines, two of the gate lines and one of the common lines. Each dual-gate pixel unit includes a first pixel and a second pixel. The first pixel is connected to the first gate line, the first common line and the first data line. The second pixel is connected to the second gate line, the first common line and the first data line. The first pixel and the second pixel are respectively disposed at two opposite sides of the first data line. The first data line and the first common line respectively transfer a data signal and a first common signal into the first pixel and the second pixel, and the first gate line and the second gate line respectively control the first pixel and the second pixel to receive the data signal.

These and other objectives of the present invention will no doubt become obvious to those of ordinary skill in the art after reading the following detailed description of the preferred embodiment that is illustrated in the various figures and drawings.

DETAILED DESCRIPTION

A main design of the present invention is that the common lines are respectively disposed between the adjacent gate lines. Please refer to FIG. 4. An equivalent circuit of a liquid crystal display panel of the present invention includes a plurality of gate lines 26 parallel to each other and a plurality of data lines 28 parallel to each other. The gate lines 26 include a first gate line 262 and a second gate line 264, and the data lines 28 and the gate lines 26 are perpendicular to each other. The data lines 28 include a first data line 282, and the gate lines 26 are parallel to a plurality of common lines 30. The common lines 30 include a first common line 302.

The liquid crystal display panel of the present invention further includes a plurality of dual-gate pixel units 32 arranged in matrix and connected to each other through the data lines, the gate lines 26 and the common lines 30. Each dual-gate pixel unit 32 is electrically connected to a data line 28, two gate lines 26 and a common line 30. The dual-gate pixel units 32 in the same column share the same data line 28, and the dual-gate pixel units 32 in the same row share the same gate line 26 and the same common line 30. The components of each dual-gate pixel unit 32 have the same connecting relations and relative positions. The present invention takes one dual-gate pixel unit 32 as an example, and the connecting relations and the relative positions among the first gate line 262, the second gate line 264, the first data line 282, the first common line 302 and a dual-gate pixel unit 32 are mentioned in the following description.

Figure 5:
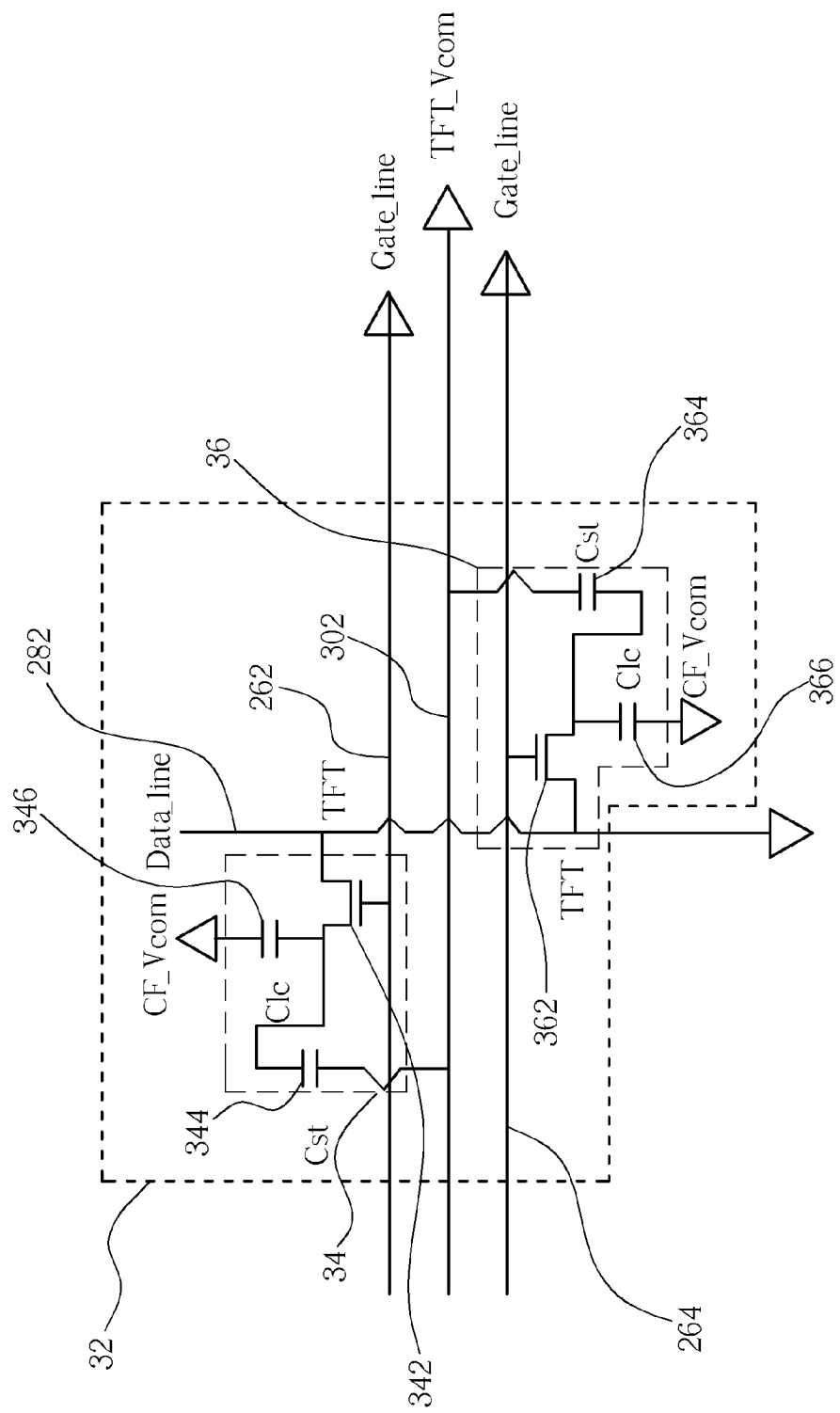
FIG. 5 is a circuit diagram of a dual-gate pixel unit of the present invention.

Please refer to FIG. 5 together. Each dual-gate pixel unit 32 includes a first pixel 34 and a second pixel 36. The first pixel 34 includes a first TFT 342, and a first liquid crystal capacitor 346 and a first storage capacitor 344 corresponding to the first TFT 342 and connected to the first TFT 342. The second pixel 36 includes a second TFT 362, and a second liquid crystal capacitor 366 and a second storage capacitor 364 corresponding to the second TFT 362 and connected to the second TFT 362. The first pixel 34 and the second pixel 36 are respectively disposed at two opposite sides of the first gate line 262 and the second gate line 264, and the first gate line 262 and the second gate line 264 are disposed at two opposite sides of the first common line 302. The first pixel 34 and the second pixel 36 are disposed at two opposite sides of the first data line 282.

The first TFT 342 has a gate electrode, a source electrode and a drain electrode. The gate electrode of the first TFT 342 is electrically connected to the first gate line 262, and the source electrode of the first TFT 342 is electrically connected to the first data line 282. The first liquid crystal capacitor 346 has a first end electrically connected to the drain electrode of the first TFT 342, and the first storage capacitor 344 has a first end electrically connected to the drain electrode of the first TFT 342. The first liquid crystal capacitor 346 has a second end electrically connected to a common electrode on the same side as a color filter for receiving a first common signal, and the first storage capacitor 344 has a second end electrically connected to the first common line 302. The first data line 282 and the first common line 302 respectively transfer a data signal and a second common signal to the first TFT 342, and the first gate line 262 controls the first TFT 342 to receive the data signal, so that the charge/discharge of the first liquid crystal capacitor 346 is controlled. The first storage capacitor 344 is used to hold a voltage difference between two ends of the first liquid crystal capacitor 346 in order to avoid the leakage of the first liquid crystal capacitor 346.

Similarly, the second TFT 362 has a gate electrode, a source electrode and a drain electrode. The gate electrode of the second TFT 362 is electrically connected to the second gate line 264, and the source electrode of the second TFT 362 is electrically connected to the first data line 282. The second liquid crystal capacitor 366 has a first end electrically connected to the drain electrode of the second TFT 362, and the second storage capacitor 364 has a first end electrically connected to the drain electrode of the second TFT 362. The second liquid crystal capacitor 366 has a second end electrically connected to the common electrode on the same side as the color filter so as to receive the first common signal, and the second storage capacitor 364 has a second end electrically connected to the first common line 302. The data line 282 and the first common line 302 respectively transfer the data signal and the second common signal to the second TFT 362, and the second gate line 264 controls the second TFT 362 to receive the data signal, so that the charge/discharge of the second liquid crystal capacitor 366 is controlled. The second storage capacitor 364 is used to hold a voltage difference between two ends of the second liquid crystal capacitor 366 in order to avoid the leakage of the second liquid crystal capacitor 366.

Figure 1:
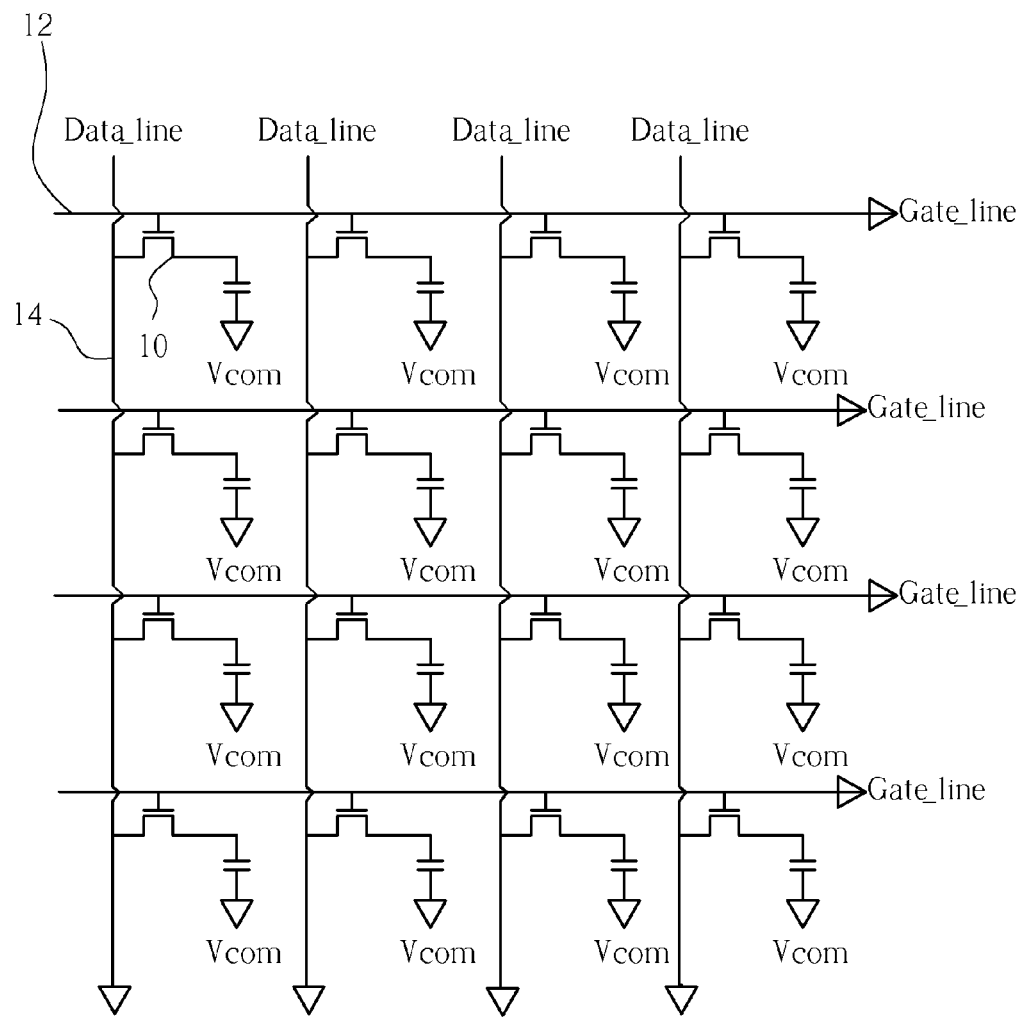
FIG. 1 and FIG. 2 are circuit diagrams of display panels according to the prior art.
Figure 2:
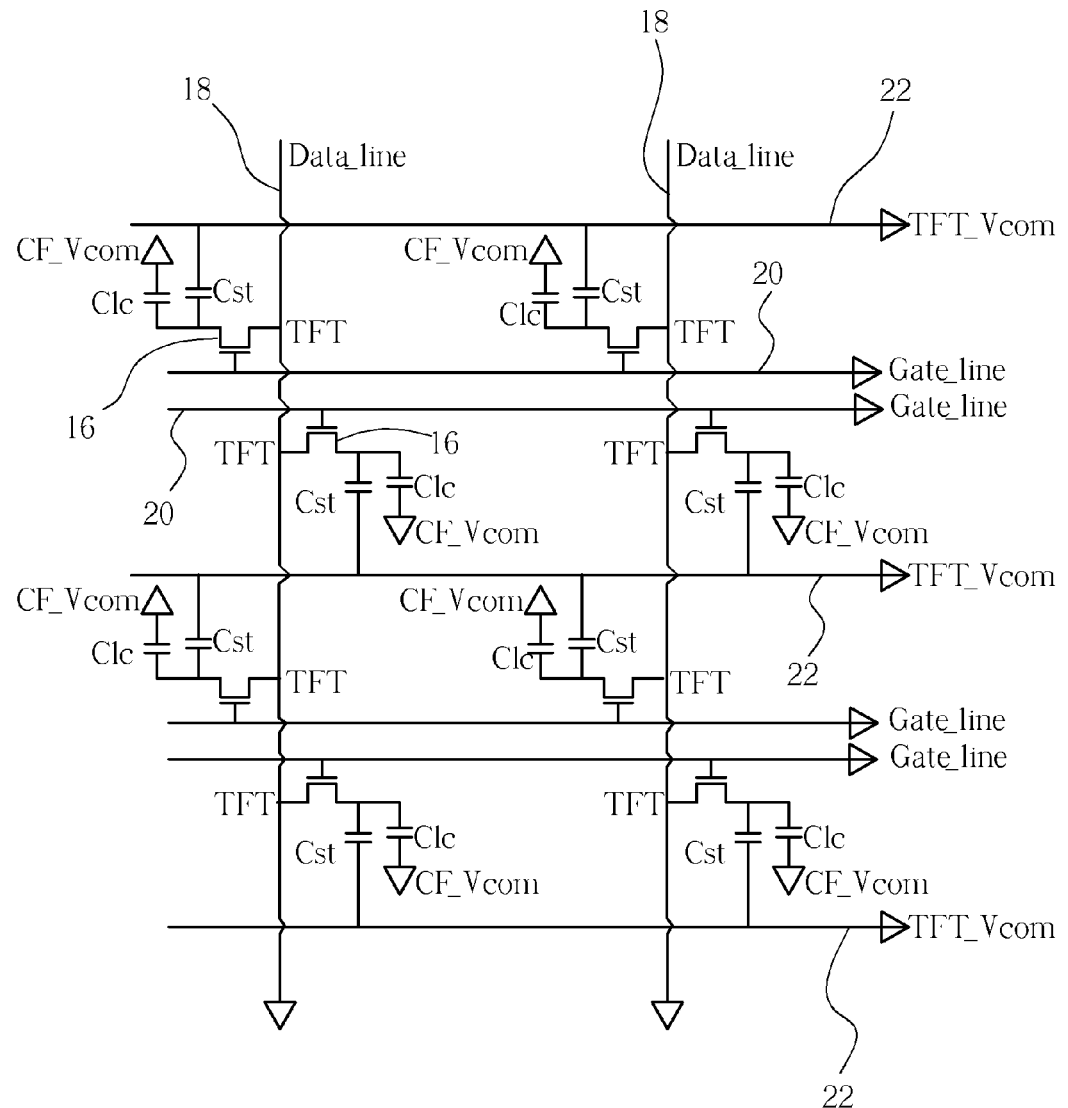
Figure 3:
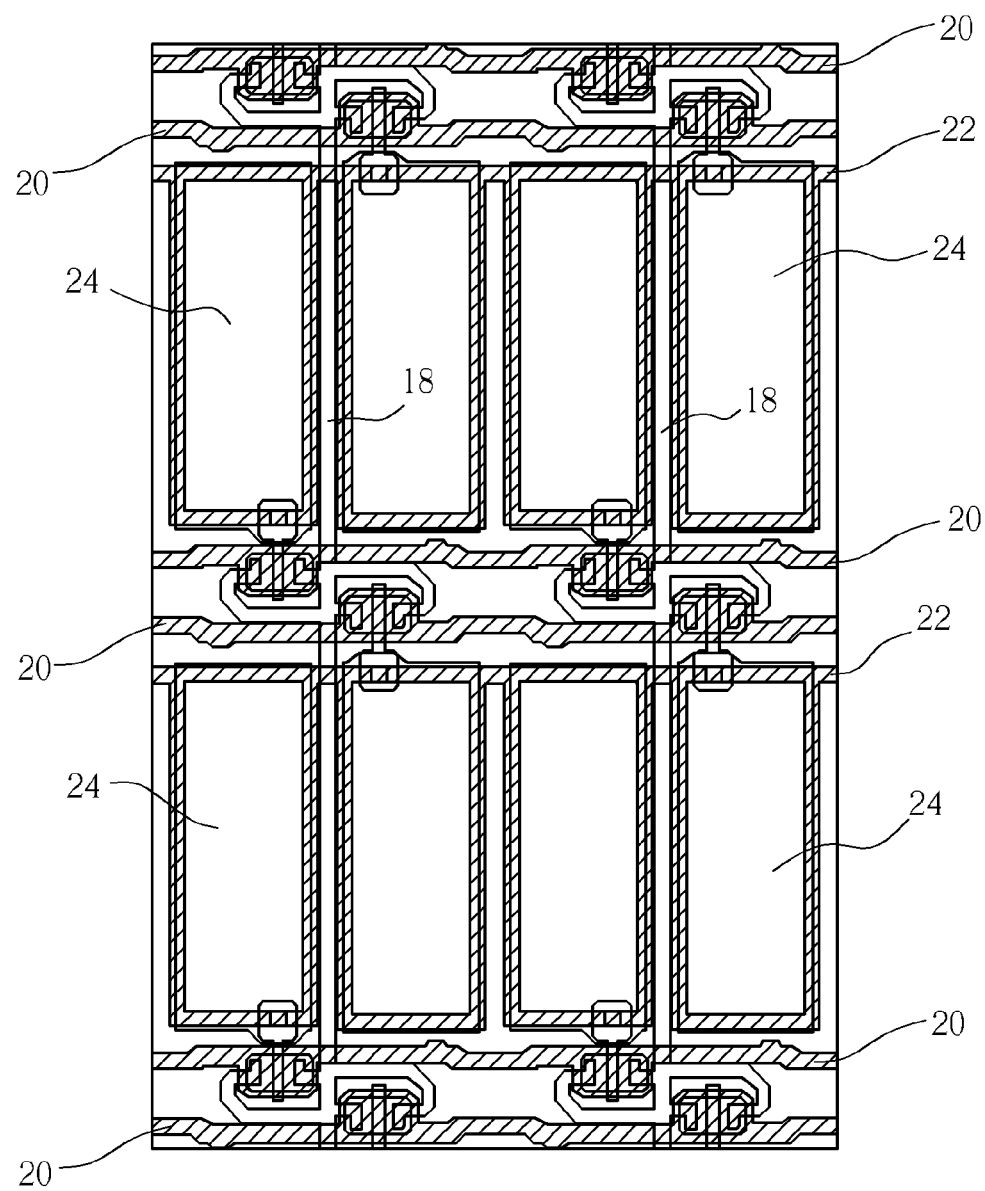
FIG. 3 is a schematic diagram illustrating a circuit layout structure of the display panel according to the prior art.
Figure 4:
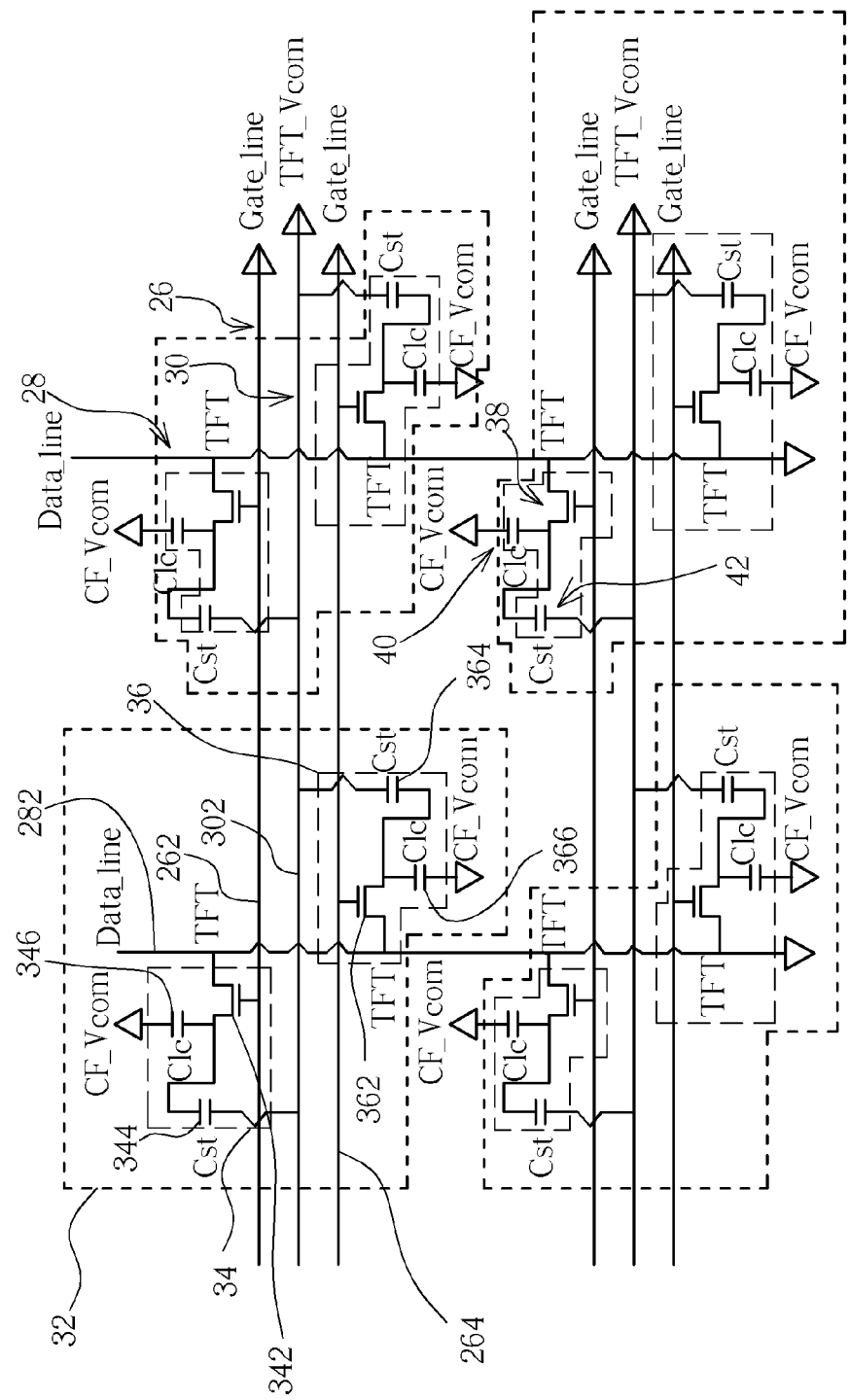
FIG. 4 is a circuit diagram of a liquid crystal display panel according to the present invention.
Figure 6:
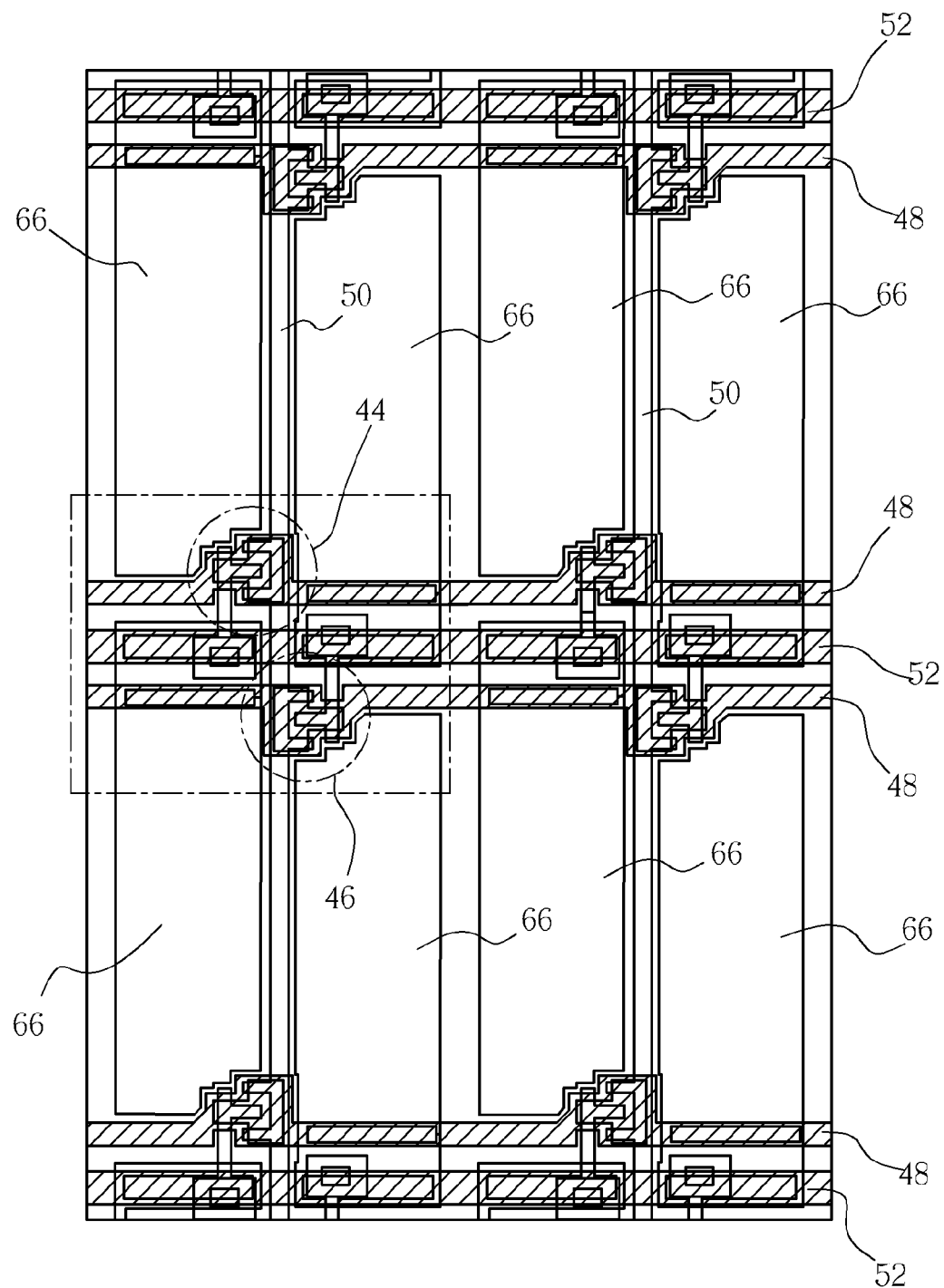
FIG. 6 is a schematic diagram illustrating a circuit layout structure of the liquid crystal display panel according to a first embodiment of the present invention.

FIG. 4 can be compared with FIG. 2 of the prior art, and the common lines in FIG. 2 and in FIG. 4 are easily shown to be at different positions. Comparing the circuit layout structures in FIG. 3 and FIG. 6, the design of the present invention as shown in FIG. 6 can increase the aperture ratio of the pixel due to the common line disposed in-between two gate lines. The present invention circuit design can be applied to a liquid crystal display panel of a vertical alignment type (VA type), a twisted nematic type (TN type), an in-plane switching type (IPS type) or a pixel design having an organic film.

Please refer to FIG. 4 again. The operation of the liquid crystal display panel of the present invention is described as follows. First, each common line 30 and each data line 28 respectively transfer a first common signal and a data signal to the storage capacitor 42 connected to the common line 30 and the TFT 38 connected to the data line 28, and each liquid crystal capacitor 40 receives the first common signal. Next, the gate lines 26 from top to bottom respectively control the TFTs 38 in each column to receive the data signal, so that the charge/discharge of the liquid crystal capacitor 40 is controlled. In addition, the storage capacitor 42 connected to the liquid crystal capacitor 40 is used to hold the voltage difference between two ends of the liquid crystal capacitor 40.

Figure 7:
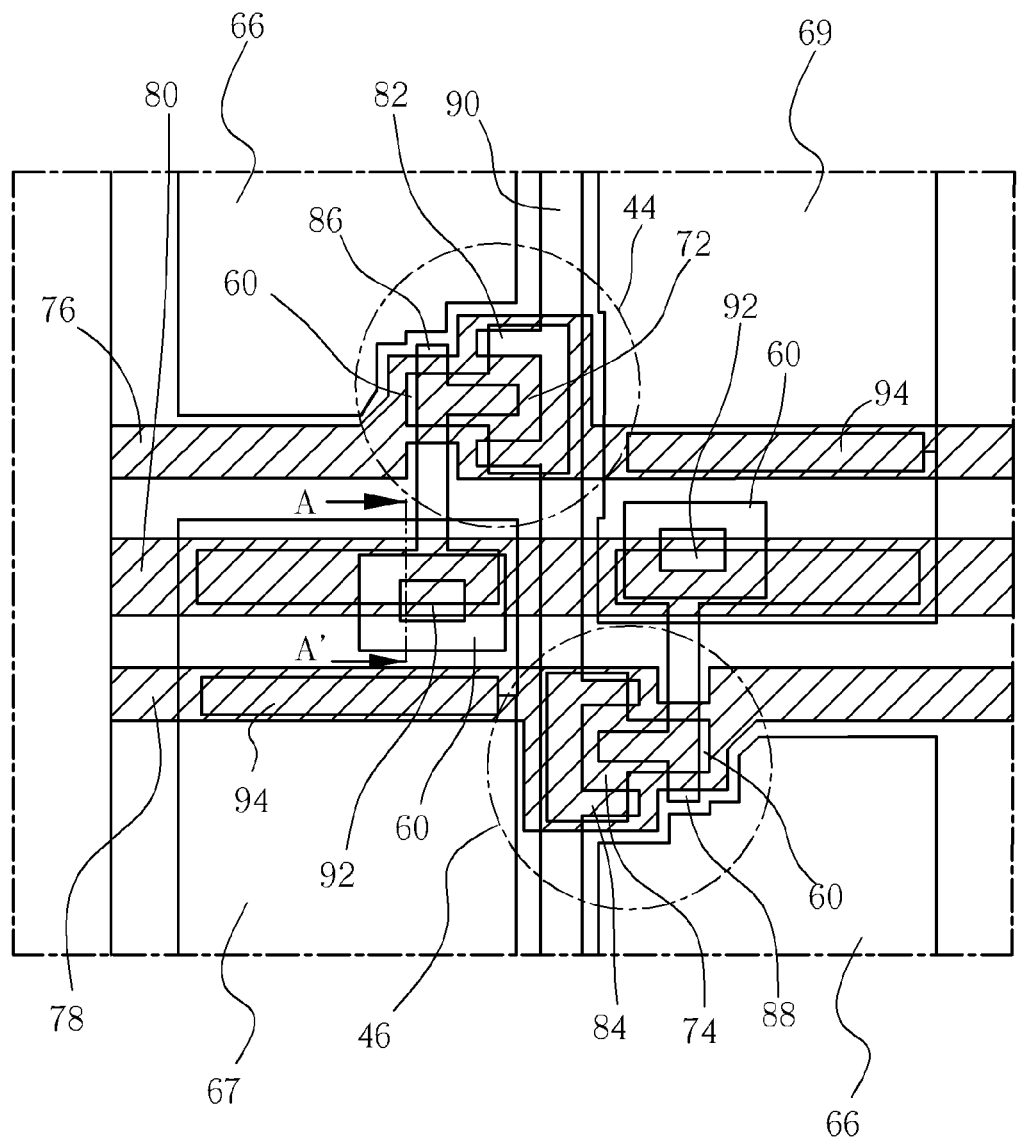
FIG. 7 is a sectional enlarged schematic diagram illustrating a circuit layout structure of the liquid crystal display panel according to a first embodiment of the present invention.

Please refer to a schematic diagram of a circuit layout structure of the liquid crystal display panel, and refer to a circuit layout of the first embodiment shown in FIG. 6 and FIG. 7 together. FIG. 7 is an enlarged schematic diagram illustrating a pixel electrode structure in the dotted frame shown in FIG. 6. Components in the dotted frame include two pixel electrodes formed by the electrode layer 66, two TFTs 44, 46 and a circuit layout surrounding the TFTs 44, 46. The TFTs 44, 46 are N type. FIG. 6 is an array liquid crystal display panel, in which the pixel electrode structure in the dotted frame is taken as a unit and the pixel electrode structures are connected to each other through gate lines 30, data lines 32, dummy lines 34, and common electrode lines 36. Because the pixel electrode structures on the display panel are arranged in matrix, the pixel electrode structures in the same column share the same data line 50, and the pixel electrode structures in the same row share the same gate line 48 and the same common line 52. The connecting relations and the relative positions of all components in each pixel electrode structure are the same, and one pixel electrode structure is taken as an example in the following description.

Figure 8:
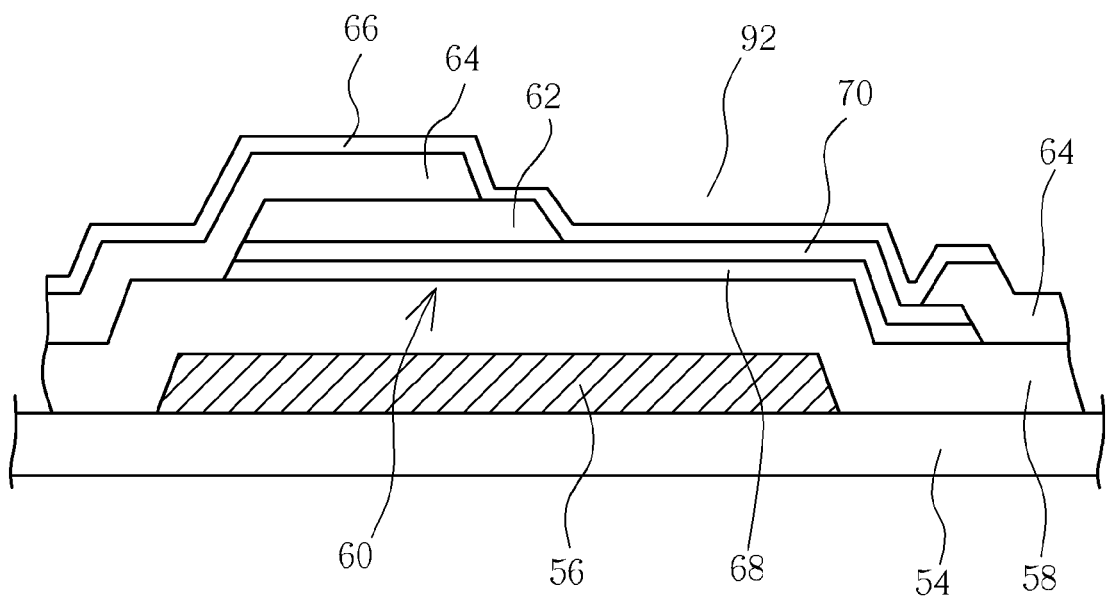
FIG. 8 is a cross-sectional view of the circuit layout structure, taken along a line AA' of FIG. 7.

In order to describe embodiments clearly, please refer to FIG. 7 and FIG. 8 together in the following description. FIG. 8 is a cross-sectional view of the circuit layout structure, taken along a line AA' of FIG. 7, and FIG. 8 can represent the relation of the stacked components in FIG. 7. FIG. 7 shows a pixel electrode structure, and the pixel electrode structure includes a transparent substrate 54, a first pixel array and a second pixel array. The first pixel array includes the first TFTs 44, the first pixel electrodes 67 and the first gate lines 76, and the second pixel array includes the second TFTs 46, the second pixel electrodes 69 and the second gate lines 78. The first pixel array and the second pixel array are formed by a first metal layer 56, an insulating layer 58, a semiconductor layer 60, a second metal layer 62, a passivation layer 64 and an electrode layer 66, and a liquid crystal layer is disposed on the electrode layer 66. The passivation layer 64 includes an insulating material, and materials of the passivation layer 64 and the insulating layer 58 are silicon nitride. A material of the electrode layer 66 is indium tin oxide (ITO), and the electrode layer 66 forms the first pixel electrodes 67 and the second pixel electrodes 69 that are respectively connected to the first TFTs 44 and the second TFTs 46.

The first metal layer 56 is disposed on the transparent substrate 54, and the first metal layer 56 forms a gate electrode 72 of the first TFT 44, a gate electrode 74 of the second TFT 46, a first gate line 76, a second gate line 78 and a common line 80 disposed under the first gate line 76 and above the second gate line 78. When the first metal layer 56 is formed, the first gate line 76 is formed to electrically connect to the gate electrode 72 of the first TFT 44, and the second gate line 78 is formed to electrically connect to the gate electrode 74 of the second TFT 46. After forming the first metal layer 56, the insulating layer 58 is formed on the first metal layer 56, and the insulating layer 58 on the first TFT 44 and the second TFT 46 is used to be a gate insulating layer. The semiconductor layer 60 is disposed on the insulating layer 58, and the semiconductor 60 is divided into a two-layer structure with a top layer and a bottom layer. The bottom layer is an amorphous silicon layer 68, and is directly disposed on the insulating layer 58. The top layer is an ohmic contact layer 70 of the doped N-type amorphous silicon. A second metal layer 62 is disposed on the ohmic contact layer 70 and the insulating layer 58, so that a source electrode 82 and a drain electrode 86 of the first TFT 44, a source electrode 84 and a drain electrode 88 of the second TFT 46, and a data line 90 are formed. The data line 90 connects the source electrode 82 of the first TFT 82 and the source electrode 84 of the second TFT 84, and the first TFT 44 and the second TFT 46 are respectively disposed at two opposite sides of the data line 90. The first TFT 44 and the second TFT 46 are respectively disposed at two opposite sides of the first gate line 76 and the second gate line 78. The source electrode 82 and the drain electrode 86 of the first TFT 44 are disposed above the gate electrode 72 of the first TFT 44, and the source electrode 84 and the drain electrode 88 of the second TFT 46 are disposed above the gate electrode 74 of the second TFT 46. The amorphous layer 68 and the ohmic contact layer 70 are disposed under the source electrode 82 and the drain electrode 86 of the first TFT 44 and the source electrode 84 and the drain electrode 88 of the second TFT 46. The data line 90 is perpendicular to the common line 80, the first gate line 76 and the second gate line 78.

Furthermore, according to FIG. 8, the first pixel electrode 67 is disposed above the first gate line 76, and overlaps the common line 80 and the second gate line 78. An overlapping area between the first pixel electrode 67 and the second gate line 78 is less than an overlapping area between the first pixel electrode 67 and the common line 80. The second pixel electrode 69 is disposed above the second gate line 78, and overlaps the common line 80 and the first gate line 76. An overlapping area between the second pixel electrode 69 and the first gate line 76 is less than an overlapping area between the second pixel electrode 67 and the common line 80.

The ohmic contact layer 70 and the second metal layer 62 are covered with the passivation layer 64, and the passivation layer 64 has through holes 92 that are respectively disposed above the drain electrode 86 and the semiconductor layer 60 of the first TFT 44 and the drain electrode 88 and the semiconductor layer 60 of the second TFT 46. Each through hole 92 is a portion of the passivation layer 64 without being connected, as shown in the cross-sectional view of FIG. 8. When the passivation layer 64 is etched to form the through holes 92, the through holes 92 can only reach to the semiconductor layer 60 because the through holes 92 can not be etched through the semiconductor layer 60 and continuously to the insulating layer 58.

The electrode layer 66 is disposed on the passivation layer 64, and the electrode layer 66 can be electrically connected to the drain electrode 86 and the semiconductor layer 60 of the corresponding first TFT 44 and the drain electrode 88 and the semiconductor layer 60 of the corresponding second TFT 46 through the through holes 92. As shown in FIG. 8, due to the through holes, the second metal layer 62 regarded as the drain electrode 86 and the semiconductor layer 60 are exposed, and can be in contact with the electrode layer 66. In order to reduce the parasitic capacitance, the electrode layer 66 has through holes 94 respectively disposed on the first gate line 76 and the second gate line 78.

In addition, the second metal layer 62 has a portion overlapping the first metal layer 56, and the electrode layer 66 in contact with the drain electrode of the TFT overlaps the first metal layer 56. The portion of the second metal layer 62 and an overlapping portion between the electrode layer 66 and the first metal layer 56 form a storage capacitor of the TFT. For example, the drain electrode 86 includes a portion extending to the common line 80 and overlapping the common line 80 and the electrode layer 66, and the portion of the drain electrode 86 and an overlapping portion between the common line 80 and the electrode layer 66 form the storage capacitor of the first TFT 44. The drain electrode 88 of the second TFT 46 includes a portion extending to the common line 80 and overlapping the common line 80 and the electrode layer 66, and the portion of the drain electrode 88 and an overlapping portion between the common line 80 and the electrode layer 66 form the storage capacitor of the second TFT 46.

Furthermore, the electrode layer 66 of this embodiment does not overlap the first gate line 76 disposed at the same side as the drain electrode 86 of the first TFT 44 and the second gate line 78 disposed at the same side as the drain electrode 88 of the second TFT 46. Accordingly, a light-shielding layer, such as black matrix, should be disposed in the color filter, and corresponds to the edge of the electrode layers connecting each TFT. When the display panel is used to form a liquid crystal display, edges of each pixel will not have light leakage, and the arrangement of the liquid crystal molecules will not be affected. The adjacent pixels will not have crosstalk of color.

The liquid crystal display panel shown in FIG. 6 and manufactured by using the above-mentioned circuit layout will now be compared with the prior art of FIG. 3. Two electrode layers 66 between the adjacent gate lines 48 and the adjacent data lines 50 respectively are display regions of two pixels. In the design of the present invention, the common line 52 does not shield an area of the transmissive region of the electrode layer 66. Further, in the same number of the transistors, the number of the common lines 52 used in FIG. 6 is smaller than the number used in FIG. 3, and FIG. 6 and the equivalent circuit of FIG. 4 have the same effect. In other words, the aperture ratio of the pixel can be raised according to the above-mentioned design of the present invention. Also, because the number of the common lines is reduced, the probability of the gate line and the common line short-circuiting can be reduced.

Figure 9:
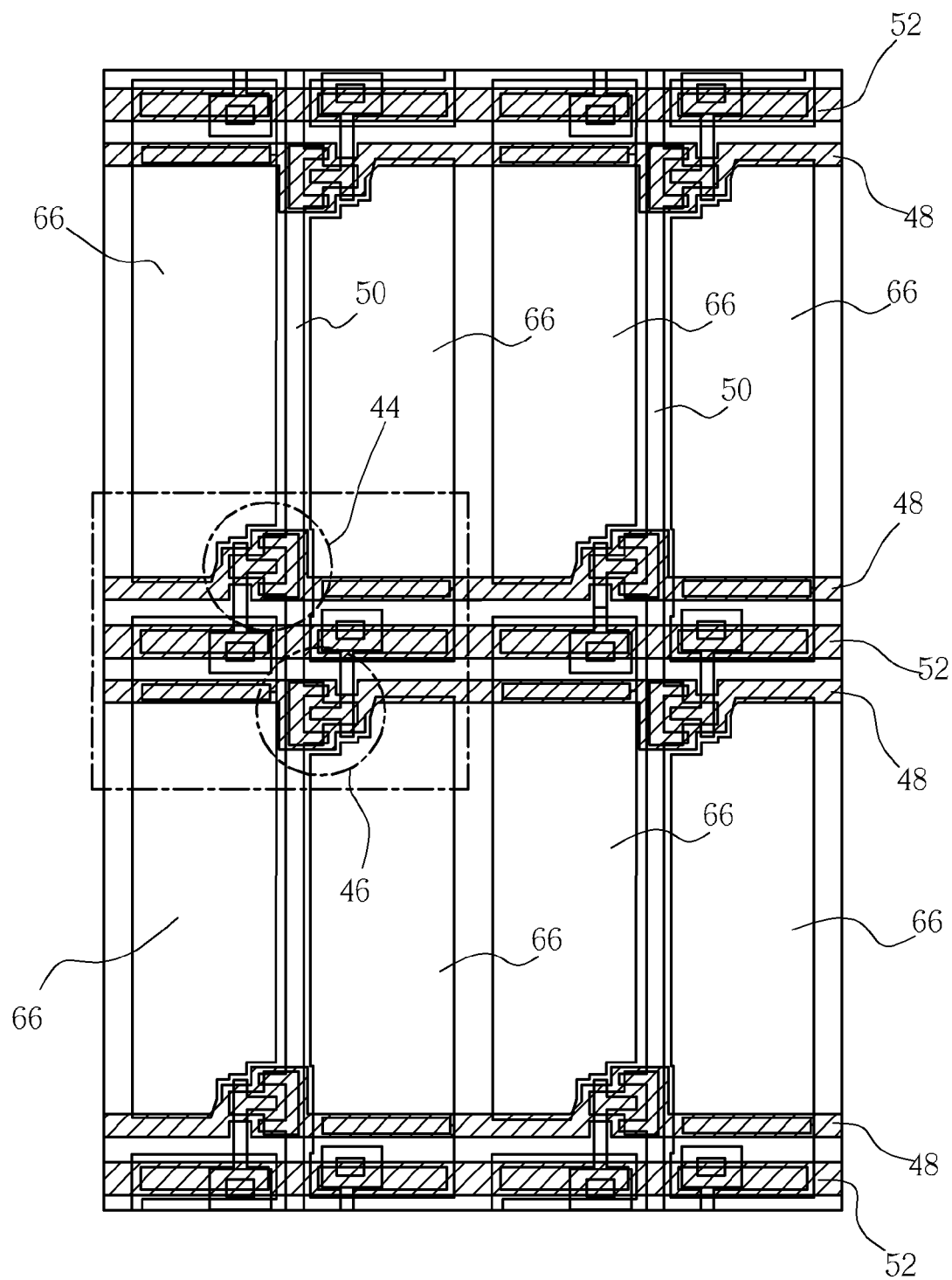
FIG. 9 is a schematic diagram illustrating a circuit layout structure of a liquid crystal display panel according to a second embodiment of the present invention.
Figure 10:
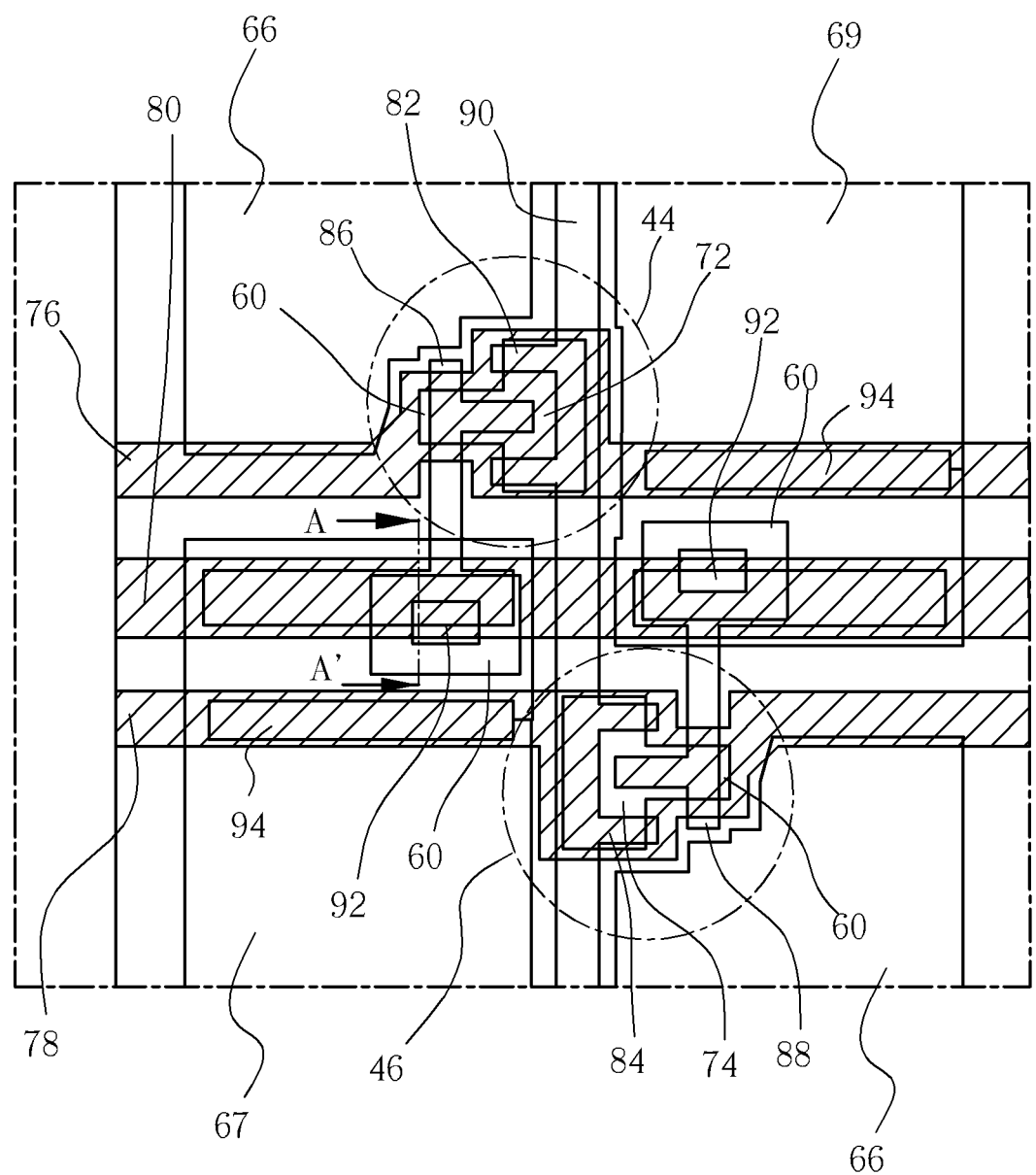
FIG. 10 is a sectional enlarged schematic diagram illustrating a circuit layout structure of the liquid crystal display panel according to a second embodiment of the present invention.

Next, please refer to a circuit layout of the second embodiment shown in FIG. 9 and FIG. 10. Different from the first embodiment, the electrode layer 66 of this embodiment has a portion partially overlapping the first gate line 76 disposed at the same side as the drain electrode 86 of the first TFT 44 and the second gate line 78 disposed at the same side as the drain electrode 88 of the second TFT 46. For this reason, at the edges of the overlapping portions between the electrode layer of each TFT and the first gate line 76 and the second gate line 78, the light shielding layer does not require to be disposed in the color filter substrate corresponding the edges. The spreading area of the storage capacitor is also increased in this design so as to reduce the probability of flicker of display panel and to increase the aperture ratio.

In summary, the present invention disposes the common line between the adjacent gate lines to reduce the number of the common lines. Accordingly, the aperture ratio of each pixel in the panel can be raised, and the probability of the gate line and the common line short-circuiting can be reduced.

Those skilled in the art will readily observe that numerous modifications and alterations of the device and method may be made while retaining the teachings of the invention.

What is claimed is:

1. A display panel, comprising:
    a plurality of gate lines, parallel to each other, and the gate lines including a first gate line and a second gate line;
    a plurality of data lines, perpendicular to the gate lines, and the data lines including a first data line;
    a plurality of common lines, parallel to the gate lines, the common lines comprising a first common line, and the first gate line and the second gate line being respectively disposed at two opposite sides of the first common line; and
    a plurality of dual-gate pixel units, each dual-gate pixel unit being connected to one of the data lines, two of the gate lines and one of the common lines, and each dual-gate pixel unit comprising:
        a first pixel connected to the first gate line, the first common line and the first data line; and
        a second pixel connected to the second gate line, the first common line and the first data line, the first pixel and the second pixel being respectively disposed at two opposite sides of the first data line.

2. The display panel of claim 1, wherein the first pixel and the second pixel are disposed at two opposite sides of the first gate line and the second gate line.

3. The display panel of claim 1, wherein the first pixel comprises:
    a first thin film transistor (TFT) having a gate electrode, a source electrode and a drain electrode, the gate electrode of the first TFT being connected to the first gate line, and the source electrode of the first TFT being connected to the first data line;
    a first liquid crystal capacitor having a first end connected to the drain electrode of the first TFT and a second end connected to a common electrode so as to receive a first common signal, the first TFT receiving a data signal transferred via the first data line, the first gate line controlling an on/off state of the first TFT, so that the first TFT controls charge/discharge of the first liquid crystal capacitor according to the data signal; and
    a first storage capacitor having a first end connected to the drain electrode of the first TFT and a second end connected to the first common line so as to receive a second common signal transferred via the first common line, and the first storage capacitor holding a voltage difference between the two ends of the first liquid crystal capacitor.

4. The display panel of claim 1, wherein the second pixel comprises:
    a second TFT having a gate electrode, a source electrode and a drain electrode, the gate electrode of the second TFT being connected to the second gate line, and the source electrode of the second TFT being connected to the first data line;
    a second liquid crystal capacitor having a first end connected to the drain electrode of the second TFT and a second end connected to a common electrode so as to receive a first common signal, the second TFT receiving a data signal transferred via the second data line, and the second gate line controlling an on/off state of the second TFT, so that the second TFT controls charge/discharge of the second liquid crystal capacitor according to the data signal; and
    a second storage capacitor having a first end connected to the drain electrode of the second TFT and a second end connected to the first common line so as to receive a second common signal transferred via the first common line, and the second storage capacitor holding a voltage difference between the two ends of the second liquid crystal capacitor.

5. The display panel of claim 1, wherein the display panel is a liquid crystal display panel.

6. The display panel of claim 1, wherein a driving method of each first pixel and each second pixel comprises:
    transferring a data signal and a common signal respectively to each first pixel and each second pixel via the first data line and the first common electrode; and
    controlling each first pixel and each second pixel to receive the data signal via the first gate line and the second gate line.

7. The display panel of claim 1, wherein the dual-gate pixel units are arranged in matrix.

8. The display panel of claim 3, wherein the gate electrode of the first TFT, the gate lines and the common lines are formed by a first metal layer, the source electrode and the drain electrode of the first TFT as well as the data lines are formed by a second metal layer, the source electrode and the drain electrode of the first TFT are disposed above the gate electrode of the first TFT, and the drain electrode of the first TFT further includes a portion extending to the first common line and overlapping the first common line.

9. The display panel of claim 8, wherein the first metal layer is covered with an insulating layer.

10. The display panel of claim 9, wherein a semiconductor layer is disposed on the insulating layer and located under the source electrode and the drain electrode, and the second metal layer is disposed on the semiconductor layer and the insulating layer.

11. The display panel of claim 10, wherein a passivation layer is disposed on the semiconductor layer and the second metal layer, and the passivation layer has a first through hole on the drain electrode respectively.

12. The display panel of claim 11, wherein an electrode layer is disposed on the passivation layer so that a first pixel electrode and a second pixel electrode are formed; the first pixel electrode is disposed under the first gate line and overlaps the first common line and the second gate line, and the first pixel electrode is electrically connected to the corresponding drain electrode through the first through hole; the second pixel electrode is disposed on the second gate line and overlaps the first common line and the gate line, and the second pixel electrode is electrically connected to the corresponding drain electrode through the first through hole; and each of the first pixel electrode and the second pixel electrode has a second through hole disposed on the second gate line, and the first gate line respectively.

13. The display panel of claim 12, wherein the electrode layer has a portion partially overlapping the first gate line and the second gate line disposed at the drain electrode of the first TFT as well as the drain electrode of the second TFT.

14. The display panel of claim 12, wherein an overlapping area between the first pixel electrode and the second gate line is less than an overlapping area between the first pixel electrode and the first common line, and an overlapping area between the second pixel electrode and the first gate line is less than an overlapping area between the second pixel electrode and the first common line.

15. The display panel of claim 11, wherein the semiconductor comprises:
an amorphous silicon layer disposed on the insulating layer; and
an ohmic contact layer disposed on the amorphous silicon layer, from which the second metal layer and the passivation layer are disposed on the ohmic contact layer.

16. The display panel of claim 11, wherein the first through hole is disposed above a portion of the semiconductor layer and a portion of the second metal layer, so that the semiconductor layer is electrically connected to the second metal layer through the electrode layer.

17. The display panel of claim 16, wherein the first through hole reaches to the semiconductor layer.

18. The display panel of claim 4, wherein the gate electrode of the second TFT, the gate lines and the common lines are formed by a first metal layer, the source electrode and the drain electrode of the second TFT as well as the data lines are formed by a second metal layer, the source electrode and the drain electrode of the second TFT are disposed above the gate electrode of the second TFT, and the drain electrode of the second TFT further includes a portion extending to the first common line and overlapping the first common line.

19. The display panel of claim 9, wherein the first metal layer is covered with an insulating layer.

20. The display panel of claim 19, wherein a semiconductor layer is disposed on the insulating layer and located under the source electrode and the drain electrode, and the second metal layer is disposed on the semiconductor layer and the insulating layer.

21. The display panel of claim 20, wherein a passivation layer is disposed on the semiconductor layer and the second metal layer, and the passivation layer has a first through hole on the drain electrode respectively.

22. The display panel of claim 21, wherein an electrode layer is disposed on the passivation layer so that a first pixel electrode and a second pixel electrode are formed; the first pixel electrode is disposed under the first gate line and overlaps the first common line and the second gate line, and the first pixel electrode is electrically connected to the corresponding drain electrode through the first through hole; the second pixel electrode is disposed on the second gate line and overlaps the first common line and the gate line, and the second pixel electrode is electrically connected to the corresponding drain electrode through the first through hole; and each of the first pixel electrode and the second pixel electrode has a second through hole disposed on the second gate line, and the first gate line respectively.

23. The display panel of claim 22, wherein the electrode layer has a portion partially overlapping the first gate line and the second gate line disposed at the drain electrode of the first TFT as well as the drain electrode of the second TFT.

24. The display panel of claim 22, wherein an overlapping area between the first pixel electrode and the second gate line is less than an overlapping area between the first pixel electrode and the first common line, and an overlapping area between the second pixel electrode and the first gate line is less than an overlapping area between the second pixel electrode and the first common line.

25. The display panel of claim 21, wherein the semiconductor comprises:
an amorphous silicon layer disposed on the insulating layer; and
an ohmic contact layer disposed on the amorphous silicon layer, from which the second metal layer and the passivation layer are disposed on the ohmic contact layer.

26. The display panel of claim 21, wherein the first through hole is disposed above a portion of the semiconductor layer and a portion of the second metal layer, so that the semiconductor layer is electrically connected to the second metal layer through the electrode layer.

27. The display panel of claim 26, wherein the first through hole reaches to the semiconductor layer.

* * * * *